United States Patent
Kim

[11] Patent Number: 6,162,664
[45] Date of Patent: *Dec. 19, 2000

[54] METHOD FOR FABRICATING A SURFACE MOUNTING TYPE SEMICONDUCTOR CHIP PACKAGE

[75] Inventor: Jin-Sung Kim, Chungcheongbuk-do, Rep. of Korea

[73] Assignee: Hyundai Electronics Industries Co., Ltd., Kyoungki-Do, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 09/168,886

[22] Filed: Oct. 9, 1998

Related U.S. Application Data

[62] Division of application No. 08/970,419, Nov. 14, 1997.

[30] Foreign Application Priority Data

Dec. 27, 1996 [KR] Rep. of Korea ............... 96-73492

[51] Int. Cl.⁷ ..................... H01L 21/50; H01L 21/44
[52] U.S. Cl. ................. 438/126; 438/613; 438/614
[58] Field of Search ........................ 438/126, 614, 438/613

[56] References Cited

U.S. PATENT DOCUMENTS

| | | | |
|---|---|---|---|
| 5,633,204 | 5/1997 | Tago et al. | 438/614 |
| 5,637,832 | 6/1997 | Danner | 174/260 |
| 5,714,803 | 2/1998 | Queyssac | 257/738 |
| 5,736,790 | 4/1998 | Iyogi et al. | 257/780 |
| 5,753,973 | 5/1998 | Yasunaga et al. | 257/737 |
| 5,920,770 | 7/1999 | Yasunaga et al. | 438/124 |

FOREIGN PATENT DOCUMENTS

| | | |
|---|---|---|
| 62-035650 | 2/1987 | Japan . |
| 6181193 | 6/1994 | Japan . |
| 846084 | 2/1996 | Japan . |

*Primary Examiner*—Wael Fahmy
*Assistant Examiner*—Neal Berezny

[57] ABSTRACT

A solder structure for a surface mounting type semiconductor chip package, and a method of fabricating the same are disclosed. The surface mounting type semiconductor chip package includes a package body having an interconnection formed therein and a semiconductor chip accommodated therein, and a plurality of double layer bumps each attached to the bottom of the package body as an external connection terminal.

23 Claims, 4 Drawing Sheets

METHOD FOR FABRICATING A SURFACE MOUNTING TYPE SEMICONDUCTOR CHIP PACKAGE

This application is a divisional of copending application Ser. No. 08/970,419, filed on Nov. 14, 1997, the entire contents of which are hereby incorporated by reference.

BACKGROUND OF THE INVENTION

1. Field of the Invention

The present invention relates to a surface mounting type semiconductor chip package and, more particularly, to a solder structure for a BGA (Ball Grid Array) package or LGA (Land Grid Array) package and a method of fabricating the same.

2. Discussion of the Related Art

FIG. 1 illustrates a conventional BGA package showing an array of solder balls 8 provided, in place of leads, on the bottom surface of an interconnection substrate of a package body 2. The conventional BGA package body occupies a smaller area than a QFP (Quad Flat Package) type, and is advantageous because the conventional BGA package shows no distortion of the leads, in contrast to the QFP type.

The steps of fabricating the conventional BGA package are outlined as follows.

After fabricating integrated circuits on a wafer, semiconductor chips 1 on the wafer are severed by sawing the wafer. Then a process of forming an interconnection substrate of a package body is performed and thus, the interconnection substrate having an interconnection therein is provided. On the upper surface of the interconnection substrate, a coat of adhesive 9 is applied to bond the severed semiconductor chip 1 thereon. After bonding the semiconductor chip 1 to the interconnection substrate, a wire bonding process is performed in which bonding pads 10 formed on the semiconductor chip 1 and respective interconnections 11 are electrically connected with fine metal lines 12.

After the wire bonding, the semiconductor chip 1 is molded using an EMC (Epoxy Molding Compound) 13. After the molding process is completed a flux coating step is performed using screen printing to transcribe a solder paste of a predetermined pattern so as to coat a flux 14 on the bottom of the interconnection substrate of the package body 2. After the flux coating, the solder balls 8 are attached to the coated flux 14. The solder balls 8 are then reflowed to fix the solder balls 8 to the package body 2 firmly. Thereafter, through cleaning and marking, a completed BGA package is produced. However, if the thermal expansion coefficients of the package body 2 of the interconnection substrate and a mounting board (not shown) are different from each other, it will have a negative effect on the package body 2.

FIG. 2 illustrates a BGA package disclosed in a Japanese Laid Open Patent No. H8-46084 and FIG. 3 shows an enlarged view of a portion A of FIG. 2. This BGA package is described, for preventing negative effects on the package body 2 due to the difference between the thermal coefficients of the package body 2 and the mounting board.

Referring to FIGS. 2 and 3, the BGA package includes at large a package body 2 having interconnections formed therein, interconnection pattern films 16 bonded to the bottom of the package body 2 using an elastic layer 15, and solder balls 8 formed on the films 16 as external connection terminals. Each of the interconnection pattern films 16 in turn includes an electrically insulating base film 17 and an interconnection pattern 18. One end of the interconnection pattern 18 being in direct contact with the base film 17 is connected to the respective solder ball 8, and the other end of the interconnection pattern 18 is electrically connected to an internal interconnection 11 formed within the package body 2.

In operation, the elastic layer 15 of the BGA package having the aforementioned system compensates for the difference between the thermal expansion coefficients of the package body 2 and the mounting board, and thus protects the solder joint. The fabrication process for the BGA package disclosed in the Japanese Laid Open Patent No. H8-46084 is identical to the above-described fabrication process of the conventional package, except for the step of attaching the interconnection pattern film 16 and the elastic layer 15.

However, the step of attaching the solder balls 8 in the conventional BGA packaging process causes a problem of reduced productivity. The conventional BGA packaging process has problems in that to perform the solder ball attaching step, a solder ball attaching equipment is needed, which increases the equipment cost and lowers the investment efficiency. Further, if one of the solder balls 8 soldered on the package body 2 were to fall off from the attached surface, rebonding of the fallen off solder ball is extremely difficult. This will inevitably increase defects in the package.

Moreover, there is a limitation on increasing the stand off height ("h" in FIG. 2) of the solder ball 8 in the conventional method of attaching the solder ball 8. This limitation places restrictions on improving the solder joint reliability and the subsequent package mounting reliability of the BGA package. If the thermal expansion coefficients of the package body 2 and the mounting substrate were not identical, the shearing force is exerted on a jointing part between the solder ball 8 and the mounting substrate due to the difference in the thermal expansion coefficient. The shearing force will eventually break the solder joint during the operation of the BGA package mounted on a mounting board because the value of the stand off height for the solder ball 8 is low. Consequently, the conventional method of joining solder balls has a problem of considerably reducing the life span of the semiconductor package.

SUMMARY OF THE INVENTION

Accordingly, the present invention is directed to a surface mounting type semiconductor chip package and a method of fabricating the same, that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purposes of the present invention, as embodied and broadly described, the surface mounting types semiconductor chip package includes a package body having an interconnection formed therein and a semiconductor chip accommodated therein, and double layer bumps. Each double layer bump is attached to the bottom of the package body and functions as an external connection terminal.

In another aspect of the present invention, there is provided a method of fabricating a surface mounting type semiconductor chip package including the steps of connecting a base layer to an interconnection of an interconnection substrate and bonding a solder layer to the base layer to form a double layer bump after a chip molding step of a packaging process.

It is to be understood that both the foregoing general description and the following detailed description are exemplary and explanatory and are intended to provide further explanation of the invention as claimed.

Briefly described, the present invention is directed to a surface mounting type semiconductor chip package comprising a package body including an interconnection substrate and a semiconductor chip, the interconnection substrate having an interconnection formed during a process of forming the interconnection substrate; and a plurality of bumps attached to a bottom of the package body and connected to the interconnection of the interconnection substrate, the bump including a base layer and a solder layer bonded to the base layer.

Moreover, the present invention is directed to a method of fabricating a surface mounting type semiconductor chip package, comprising the steps of fabricating an interconnection substrate in a package body; forming a base layer electrically connected to an interconnection of the interconnection substrate, during the fabricating step; bonding a semiconductor chip on the interconnection substrate; performing a molding process; and forming a solder layer on the base layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings:

FIG. 5 illustrates an enlarged view of "B" part of. FIG. 4;

DETAILED DESCRIPTION OF THE PREFERRED EMBODIMENTS

Reference will now be made in detail to the preferred embodiments of the present invention, examples of which are illustrated in the accompanying drawings.

Figure 1:
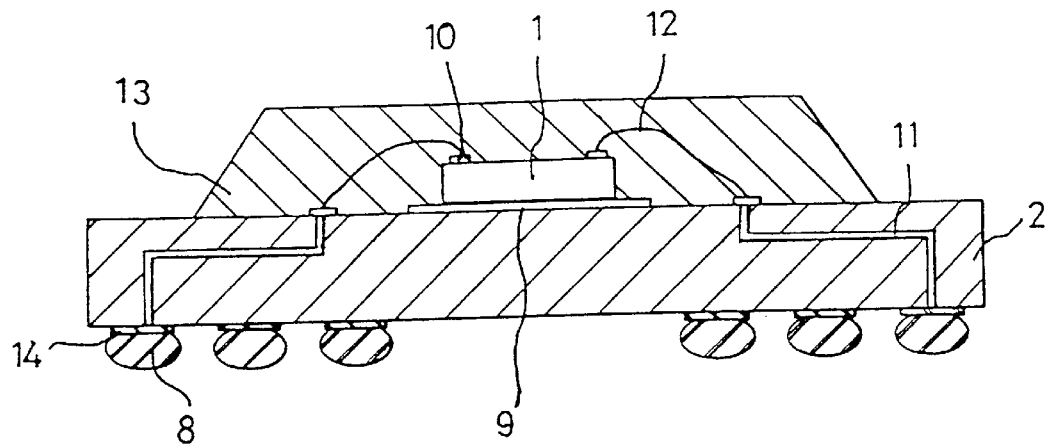
FIG. 1 illustrates a longitudinal cross-sectional view showing an example of a conventional BGA semiconductor chip package.
Figure 2:
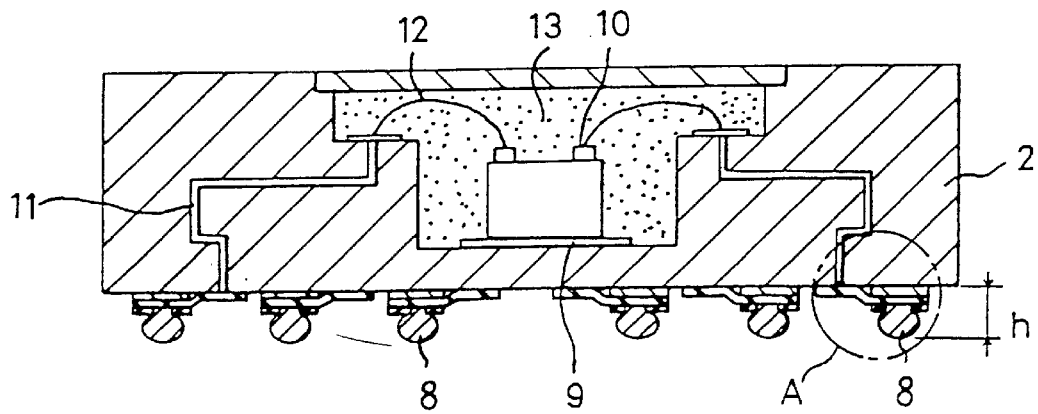
FIG. 2 illustrates a longitudinal cross-sectional view showing another example of a conventional BGA semiconductor chip package.
Figure 3:
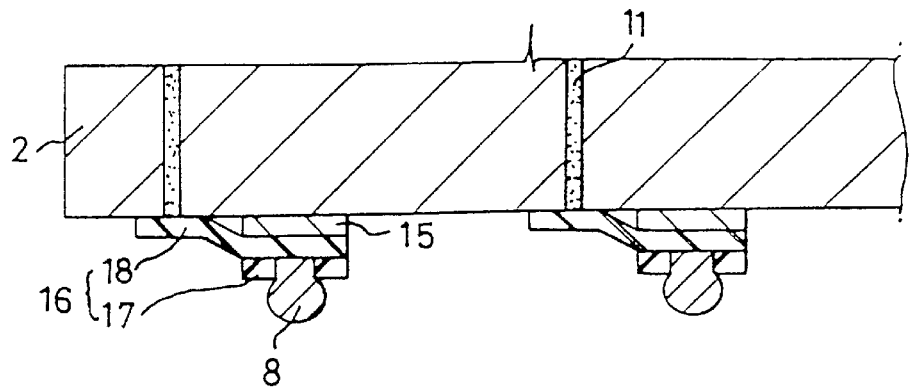
FIG. 3 illustrates an enlarged view including an enlarged view of "A" part of FIG. 2.
Figure 4:
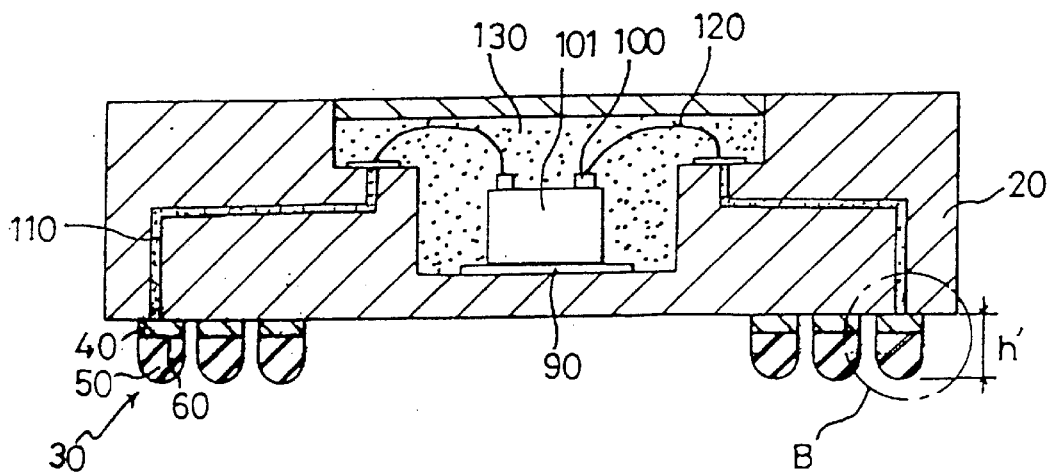
FIG. 4 illustrates a longitudinal cross-sectional view showing a semiconductor chip package in accordance with a first embodiment of the present invention.
Figure 5:
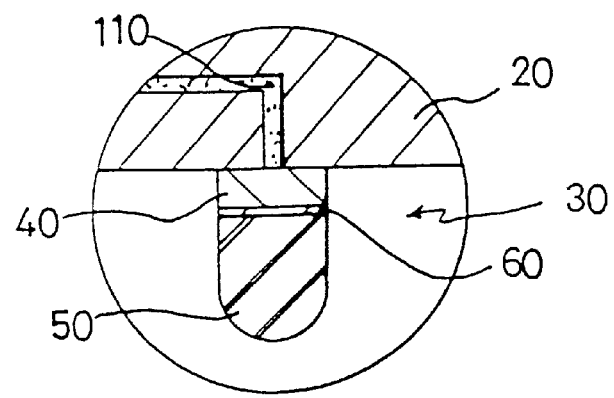
Figure 6:
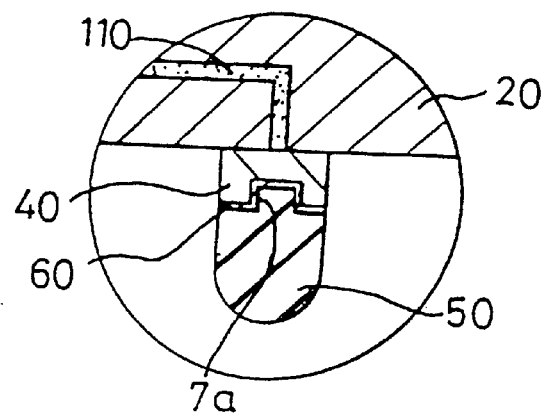
FIG. 6 illustrates another example of an enlarged view of "B" part of FIG. 4.
Figure 7:
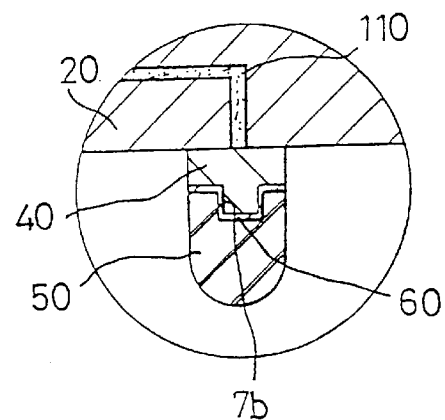
FIG. 7 illustrates another example of an enlarged view of "B" part of FIG. 4.

FIG. 4 illustrates a longitudinal cross-sectional view showing a semiconductor chip package in accordance with a first embodiment of the present invention, FIG. 5 illustrates an enlarged view of "B" part in FIG. 4, FIG. 6 illustrates another example of the "B" part in FIG. 4, and FIG. 7 illustrates another example of the "B" part in FIG. 4.

Referring to FIGS. 4 and 5, the semiconductor chip package in accordance with the first embodiment of the present invention includes a package body 20 having a semiconductor chip 101 and an interconnection line 110 formed within an interconnection substrate, and a plurality of double layer bumps 30 which function as external connection terminals. The double layer bumps 30 are attached to the bottom of the interconnection substrate of the package body 20.

As shown in FIG. 5, each of the double layer bumps 30 has a bi-layer made of a flat base layer 40 and a solder layer 50 bonded to the base layer 40. The base layer 40 made of a metal, e.g. copper, is either formed to have a thickness of 45 $\mu$m by photoetching, or formed by primary photoetching and one of electrolysis and non-electrolysis copper plating to have a thickness of 45 $\mu$m, for increasing the stand off height (h') of the double layer bump 30. Then a metal plating 60 made of an Ni.Au or Sn.Pb alloy is formed on the surface of the base layer 40 for increasing the bonding force to the solder layer 50.

The metal plating 60 of the base layer 40 is formed to have a thickness of 5~40 $\mu$m if the Ni.Au alloy plating is employed, and to have a thickness of 10~100 $\mu$m if the Sn.Pb alloy plating is employed. Then a solder paste of a predetermined pattern coated on a metal mask is transcribed onto the base layer 40, by screen printing, to form the solder layer 50 having a thickness of 100~500 $\mu$m. Accordingly, the double layer bump 30 having the base layer 40 and the solder layer 50 is formed with a minimum height of 150 $\mu$m. The basic composition ratio of Sn and Pb in the formation of the Sn.Pb alloy plating 60 and in the formation of the solder layer 50 is 90:10, where silver (Ag) may be added thereto to increase the surface hardness of each of the plating 60 and the solder layer 50.

As shown in FIGS. 6 and 7, a recess 7a or a projection 7b may be formed in the base layer 40 for increasing the contact area between the base layer 40 and the solder layer 50.

The method of fabricating the double layer bump of the present invention will be explained.

The double layer bump 30 for the semiconductor chip package of the present invention is formed on the bottom of the interconnection substrate through two processes. The first process involves the step of forming the base layer 40 during the process of fabricating the interconnection substrate in the package body 20, which is a separate process from the package fabrication process. The package fabrication process involves chip bonding, wire bonding and molding steps for attaching an encapsulated semiconductor chip to the interconnection substrate. The second process involves the step of forming the solder layer 50 which is performed after the molding step of the package fabrication process.

More particularly, in the first process the base layer 40 and the metal plating 60 are formed to have a total thickness of 50–150 $\mu$m. At first, the base layer 40 made of a thin copper film having a thickness of at least 45 $\mu$m, is formed by photoetching or by one of electrolysis and non-electrolysis copper plating after primary photoetching. A metal plating 60 made with an Ni.Au or Sn.Pb alloy is formed on the surface of the base layer 40 for increasing the bonding force of the base layer 40 to the solder layer 50. The solder layer 50 is to be formed subsequently by screen printing.

Considering the total thickness of the double layer bump 30, the metal plating 60 is preferably formed to have a thickness of 5~40 μm in the case of using an Ni.Au alloy, and to have a thickness of 10~100 μm in the case of using a Sn.Pb alloy.

After forming the base layer 40 and metal plating 60 on the interconnection substrate of the package body 20, chip bonding, wire bonding and molding processes are performed in succession. That is, die bonding for bonding the semiconductor chip 101 to the interconnection substrate via an adhesive 90, wire bonding using fine metal lines 120 for electrically connecting the bonding pads 100 to the interconnections 110 of the interconnection substrate of the package body 20, and molding for encapsulating the semiconductor chip 101 with EMC (Epoxy Molding Compound), are performed in succession.

After completing the molding process, the second process of forming the solder layer 50 is performed to complete the formation of the double layer bump 30. In the second process, the package body 20 is turned upside down to place a metal mask on the bottom of the package body 20. The metal mask has a coat of solder paste having a predetermined pattern, and is utilized to transcribe the solder paste to the metal plating 60 by screen printing. As a result, the solder layer 50 in the form of a plate is formed.

In considering the total thickness of the double layer bump 30, by screen printing the solder layer 50 is formed on the metal plating 60 coated on the base layer 40, and has a thickness of 100~500 μm. The basic composition ratio of Sn to Pb in forming the Sn.Pb alloy plating 60 and the solder layer 50 is 90:10, where silver (Ag) may be added thereto to increase the surface hardness of the metal plating 60 and the solder layer 50.

As described above, a recess 7a or a projection 7b as shown in FIGS. 6 and 7 may be formed in the base layer 40 for increasing the contact area between the base layer 40 and the solder layer 50. The increased contact area provides a greater interfacial bonding force between the base layer 40 and the solder layer 50.

After initially forming the solder layer 50 using screen printing, the solder layer 50 is subjected to reflow, i.e. heat treatment is applied, to form a round end of the solder layer 50. The round end of the solder layer 50 is formed due to surface tension. The formation of the bi-layered double layer bump 30 is thereby completed.

Accordingly, the method of fabricating a surface mounting type semiconductor chip package of the present invention includes the steps of forming a base layer on the bottom of an interconnection substrate of a package body for electrically connecting an external connection electrode with the interconnection substrate, and then bonding a solder layer to the base layer subsequent to a molding process, to form a double layer bump, whereby the productivity of the packaging process and the bonding reliability between the double layer bump and a mounting board, which is employed to mount the semiconductor package thereon, are improved.

Figure 8:
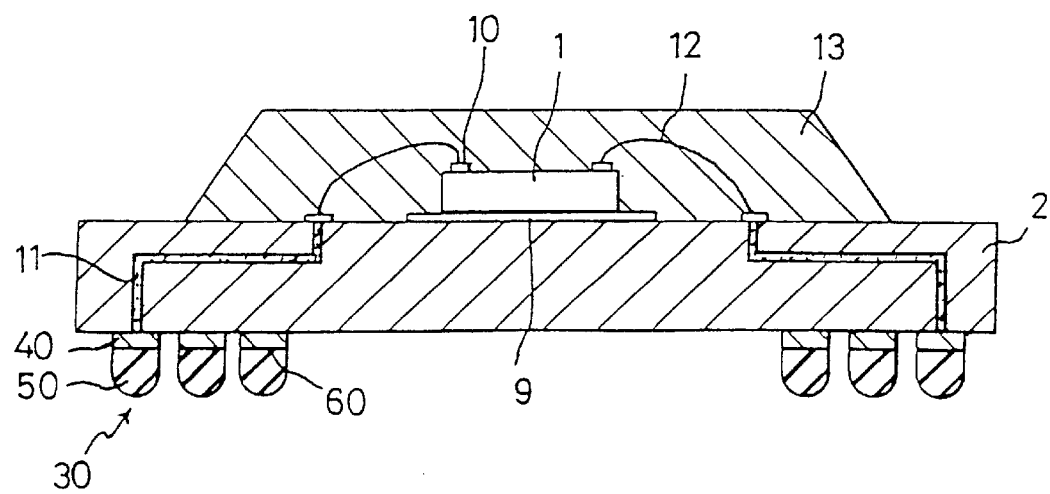
FIG. 8 illustrates a longitudinal cross-sectional view showing a semiconductor chip package in accordance with a second embodiment of the present invention.

FIG. 8 illustrates a longitudinal cross-sectional view showing a semiconductor chip package in accordance with a second embodiment of the present invention. This embodiment of the present invention is directed to the cavity up type of an LGA (land grid array) package As shown in FIG. 8, in the wiring bonding step the fine metal lines 12 electrically connect the bonding pads 10 and the interconnection lines 11, and in the molding step the semiconductor chip 1 formed on the top of the package body 2 is sealed with the EMC 13. The double layer bump 30 is formed on the bottom surface of the interconnect substrate of the package body 2 for electrically connecting an external connection electrode with the interconnection substrate via the interconnection lines 11. Similar to the first embodiment of the present invention, the base layer 40 and the metal plating 60 are formed in the process of fabricating the interconnection substrate in the package body 2. Then the semiconductor chip 1 is bonded to the interconnection substrate via an adhesive 9, electrically connected to the interconnection line 11 via the metal line 12, and is encapsulated by the molding process using the EMC 13. After the molding process is completed, the solder layer 50 is formed by screen printing and reflowing. A recess 7a or projection 7b as shown in FIGS. 6 and 7 may be formed in the base layer 40 for increasing the contact area between the base layer 40 and the solder layer 50 Thus, the double layer bump according to the embodiments of the present invention is easily applicable to any one of the grid array type packages, such as the LGA package and BGA package, improves the bond reliability of a solder joint of the package, and prolongs the lifespan of the semiconductor chip package.

By substituting the complicated solder ball attaching step of the conventional packaging process with a simple step, the present invention improves the productivity of the package process. That is, since an interconnection substrate is first formed and introduced into the packaging process to form a base layer of a double layer bump, the present invention improves the productivity of the packaging process by permitting simply the screen printing and reflowing process of a solder layer in the packaging process.

In contrast to the conventional packaging process which requires an expensive solder ball attaching equipment for attaching the solder ball onto the interconnection substrate, the method of fabricating a semiconductor chip package according to the embodiments of the present invention employs an inexpensive screen printing equipment, reducing the production cost and improving the investment efficiency.

The package of the present invention has a stand off height which is twice greater than that of the conventional solder ball 8 structure package. Furthermore, the present invention improves the reliability characteristic of the solder joint more than two times that of the conventional device (based on the experimental equation for obtaining reliability). Moreover, if a recess or projection, e.g. 7a or 7b, is formed in the base layer, mounting reliability characteristic is improved more than three times compared to the conventional device.

In addition, the package of the present invention reduces the production cost in fabricating the interconnection substrate and improves productivity in fabricating the interconnection substrate even in comparison with the conventional LGA package which employs land type, external connection terminals, and can prolong the lifespan of the semiconductor chip package when the semiconductor chip package is mounted on a mounting board.

Therefore, by improving the solder structure and its fabricating method for a surface mounting type semiconductor chip package, such as the BGA or LGA package, the present invention improves, not only the solder joint reliability characteristic and the mounting reliability characteristic of the semiconductor chip package, but also the productivity of the semiconductor chip package.

It will be apparent to those skilled in the art that various modifications and variations can be made in the surface mounting type semiconductor chip package and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A method of fabricating a semiconductor chip package, comprising the steps of:

fabricating an interconnection substrate in a package body, the interconnection substrate including an interconnection;

forming a conductive base layer on a surface of the interconnection substrate such that the base layer is electrically connected to the interconnection;

securing a semiconductor chip to the package body after forming the base layer; and forming a solder layer on the base layer.

2. A method as claimed in claim 1, further comprising the step of:

forming a metal plating on the base layer.

3. A method as claimed in claim 2, wherein the metal plating has a thickness of between about 5 and 40 micrometers.

4. A method as claimed in claim 2, wherein the metal plating is formed with one of an Ni Au alloy or an Sn Pb alloy.

5. A method as claimed in claim 1, wherein the step of forming the solder layer includes the step of:

transcribing a solder paste of a predetermined pattern onto the base layer using screen printing.

6. A method as claimed in claim 5, wherein the step of forming the solder layer further includes the step of:

reflowing the transcribed solder paste with heat treatment.

7. A method as claimed in claim 1, wherein a thickness of the solder layer is approximately 100–500 $\mu$m.

8. A method as claimed in claim 1, wherein the step of forming the base layer includes one of the steps of photo-etching, electrolysis copper plating, or non-electrolysis copper plating.

9. A method as claimed in claim 1, wherein the step of forming the base layer includes the step of forming a projection projecting from a surface of the base layer, the solder layer surrounding at least a portion of the projection when formed on the base layer.

10. A method as claimed in claim 1, wherein the step of forming the solder layer includes the steps of:

turning the package body over;

covering a bottom surface of the package body with a mask; and transcribing a solder paste of a predetermined pattern onto the base layer.

11. A method as claimed in claim 1, wherein the step of forming the base layer includes the step of forming a recess in the base layer; and the step of forming the solder layer includes the step of forming at least a part of the solder layer within the recess in the base layer.

12. A method as claimed in claim 1, further comprising the step of performing a molding process.

13. A method as claimed in claim 12, wherein the step of performing a molding process includes the step of encapsulating the semiconductor chip within the package body after forming the base layer.

14. A method as claimed in claim 1, further comprising the steps of:

providing at least one bonding pad on the semiconductor chip; and after forming the base layer, performing a wire bonding process to electrically connect the interconnection to the at least one bonding pad.

15. A method as claimed in claim 1, wherein the step of securing a semiconductor chip to the package body includes the step of bonding the semiconductor chip to the interconnection substrate.

16. A method as claimed in claim 1, wherein the step of securing a semiconductor chip to the package body includes the step of bonding the semiconductor chip to an interior surface of the package body.

17. A method for fabricating a semiconductor chip package, comprising the steps of:

fabricating an interconnection substrate in a package body, the interconnection substrate including an interconnection;

forming a conductive base layer on a surface of the interconnection substrate, the base layer being electrically connected to the interconnection;

encapsulating a semiconductor chip within the package body after forming the base layer; and forming a solder layer on the base layer.

18. A method as claimed in claim 17, wherein the step of encapsulating the semiconductor chip within the package body includes the step of introducing an epoxy molding compound into the package body.

19. A method as claimed in claim 17, further comprising the steps of, after the step of forming the base layer:

bonding the semiconductor chip on the interconnection substrate; and electrically connecting the semiconductor chip to the interconnection.

20. A method as claimed in claim 17, wherein the step of forming the solder layer includes the steps of:

turning the package body over;

covering a bottom surface of the package body with a mask; and transcribing a solder paste of a predetermined pattern onto the base layer.

21. A method as claimed in claim 17, wherein the step of forming the base layer includes the step of forming a projection projecting from a surface of the base layer, the solder layer surrounding at least a portion of the projection when formed on the base layer.

22. A method as claimed in claim 17, wherein the step of forming the base layer includes the step of forming a recess in the base layer; and the step of forming the solder layer includes the step of forming at least a part of the solder layer within the recess in the base layer.

23. A method as claimed in claim 17, further comprising the step of, prior to the encapsulation step, forming a metal plating on the base layer, the metal plating having a thickness of between about 5 and 40 micrometers.

* * * * *